United States Patent
Wang et al.

(10) Patent No.: US 10,476,717 B1
(45) Date of Patent: Nov. 12, 2019

(54) DIGITAL-CONTROLLED VECTOR SIGNAL MODULATOR

(71) Applicant: National Chung-Shan Institute of Science and Technology, Taoyuan (TW)

(72) Inventors: Tao Wang, Taoyuan (TW); Hung-Ting Chou, New Taipei (TW); Chien-Te Yu, Taoyuan (TW); Ching-I Chien, Kaohsiung (TW)

(73) Assignee: National Chung-Shan Institue of Science and Technology, Taoyuan (TW)

( * ) Notice: Subject to any disclaimer, the term of this patent is extended or adjusted under 35 U.S.C. 154(b) by 0 days.

(21) Appl. No.: 16/234,484

(22) Filed: Dec. 27, 2018

(51) Int. Cl.
| | |
|---|---|
| *H04L 27/18* | (2006.01) |
| *H04B 1/04* | (2006.01) |
| *H03F 3/19* | (2006.01) |
| *H03F 3/45* | (2006.01) |
| *H03F 3/68* | (2006.01) |

(52) U.S. Cl.
CPC ............. *H04L 27/18* (2013.01); *H03F 3/19* (2013.01); *H03F 3/45071* (2013.01); *H03F 3/68* (2013.01); *H03F 2200/336* (2013.01); *H03F 2200/421* (2013.01); *H03F 2200/451* (2013.01)

(58) Field of Classification Search
CPC ......... H04L 27/00; H04L 27/18; H04L 27/20; H04B 1/04
See application file for complete search history.

(56) References Cited

U.S. PATENT DOCUMENTS

| | | | | |
|---|---|---|---|---|
| 7,295,819 | B2* | 11/2007 | Kenington | H03F 1/3247 455/113 |
| 8,233,858 | B2* | 7/2012 | Sorrells | H03F 1/32 455/102 |
| 2013/0136209 | A1 | 5/2013 | Saunders | |
| 2013/0259152 | A1* | 10/2013 | Simon | H04L 27/00 375/295 |
| 2018/0309502 | A1* | 10/2018 | Khandani | H04B 7/15557 |

FOREIGN PATENT DOCUMENTS

| | | | | |
|---|---|---|---|---|
| GB | 2274950 A | * | 8/1994 | ......... H03F 1/3241 |
| KR | 10-2011-0064892 A | | 6/2011 | |

OTHER PUBLICATIONS

Tirdad Sowlati et al., A 60-GHz 144-Element Phased-Array Transceiver for Backhaul Application, IEEE Journal of Solid-State Circuits, vol. 53, No. 12, Dec. 2018, pp. 3640-3659.

* cited by examiner

*Primary Examiner* — Blane J Jackson
(74) *Attorney, Agent, or Firm* — Winston Hsu

(57) ABSTRACT

A vector modulator includes a quadrature component generator, configured to generate an input in-phase signal and an input quadrature signal according to an input radio frequency (RF) signal; a switching circuit, receiving a plurality of bits, comprising a plurality of switches controlled by the plurality of bits, configured to generate an output in-phase signal and an output quadrature signal according to the plurality of bits, where the output in-phase signal and the output quadrature signal are related to input in-phase signal and the input quadrature signal; and a combining module, configured to generate an output RF signal according to the output in-phase signal and the output quadrature signal.

6 Claims, 4 Drawing Sheets

DIGITAL-CONTROLLED VECTOR SIGNAL MODULATOR

BACKGROUND OF THE INVENTION

1. Field of the Invention

The present invention relates to a digital-controlled vector signal modulator, and more particularly, to a vector signal modulator directly controlled by digital signal without digital-to-analog signal conversion.

2. Description of the Prior Art

Electronic systems, such as communication systems and test instruments, use vector signal modulators to generate vector signals that meet the amplitude and phase requirement. In a vector signal modulator, a signal is separated to two signals with different phase degree, i.e., the in-phase (I) and quadrature (Q) signals, first. After then, the amplitudes of the in-phase (I) and quadrature (Q) are modulated, respectively, and finally combined together to generate the a vector signal which amplitude and phase both meet requirement. For instance, when the I and Q channels (i.e. signal paths) of the modulator are calibrated to be equal in gain responses, a 45° degree vector signal is generated. °.

Conventional vector modulators utilize variable gain amplifiers (VGAs) to adjust the in-phase and the quadrature signals. However, these VGAs use analog signals to control the gain of the VGAs, and therefore digital to analog converters (DACs) are required. The need of DAC complicates the design of a vector signal modulator and increases production cost.

SUMMARY OF THE INVENTION

It is therefore a primary objective of the present invention/application to provide a vector modulator with low complexity, to reduce over disadvantages of the prior art.

An embodiment of the present invention discloses a vector modulator comprising a quadrature component generator, configured to generate an input in-phase signal and an input quadrature signal according to an input radio frequency (RF) signal; a switching circuit, receiving a plurality of bits, comprising a plurality of switches controlled by the plurality of bits, configured to generate an output in-phase signal and an output quadrature signal according to the plurality of bits, where the output in-phase signal and the output quadrature signal are related to input in-phase signal and the input quadrature signal; and a combining module, configured to generate an output RF signal according to the output in-phase signal and the output quadrature signal.

These and other objectives of the present invention will no doubt become obvious to those of ordinary skill in the art after reading the following detailed description of the preferred embodiment that is illustrated in the various figures and drawings.

DETAILED DESCRIPTION

The present invention proposes to realize a vector signal modulator directly from the digital control signal without DACs, saving time and the cost the device considerably.

Figure 1:
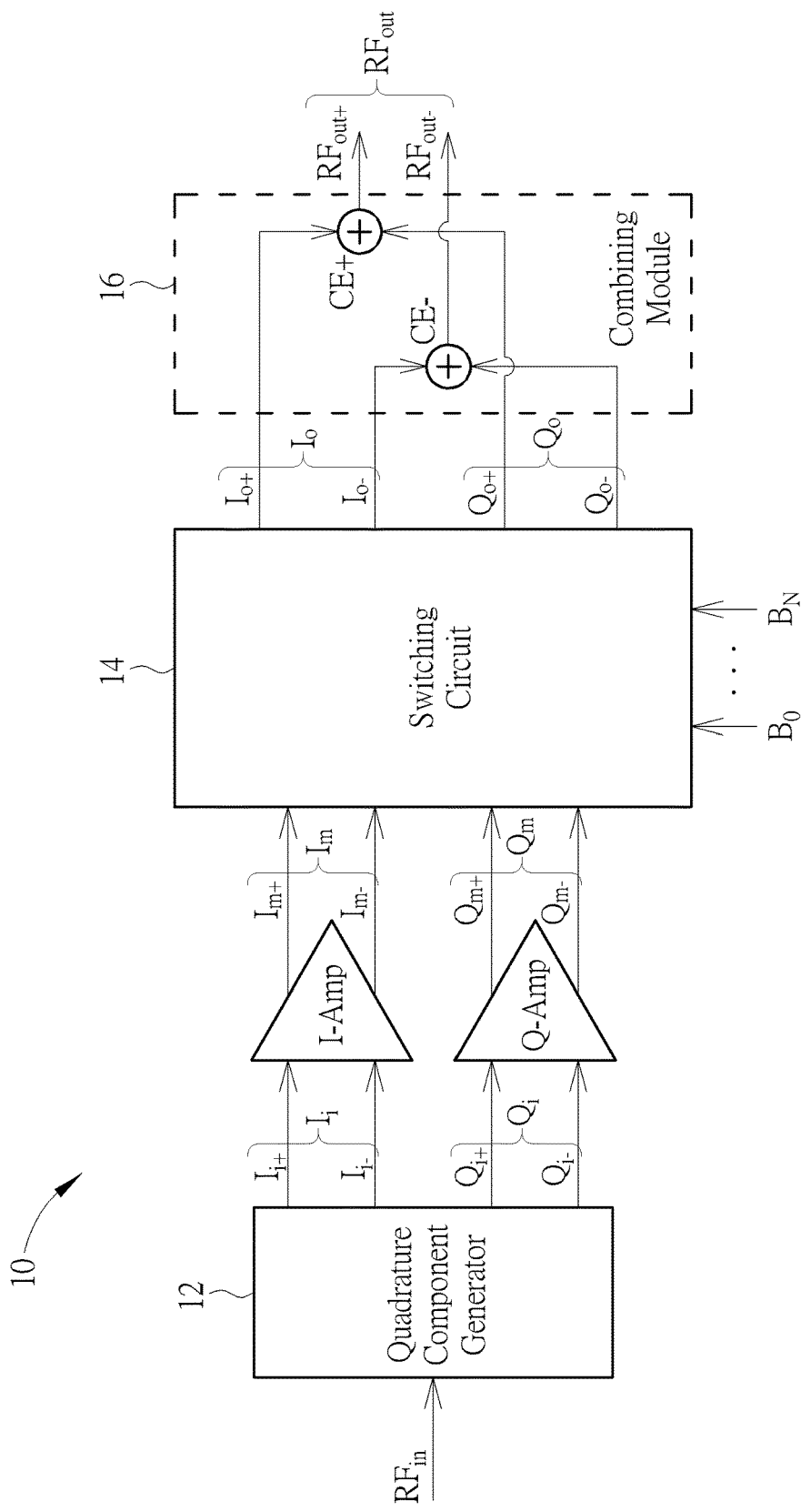
FIG. 1 is a schematic diagram of a vector modulator according to an embodiment of the present invention.

FIG. 1 is a schematic diagram of a vector modulator 10 according to an embodiment of the present invention. The vector modulator 10 comprises a quadrature component generator 12, an in-phase amplifier I-Amp, a quadrature amplifier Q-Amp, a switching circuit 14 and a combining module 16. Note that, the vector modulator 10 does not include any digital-to-analog converter (DAC). Specifically, the quadrature component generator 12 receives an input radio frequency (RF) signal $RF_{in}$ and generates an input in-phase signal $I_i$ and an input quadrature signal $Q_i$ according to the RF signal $RF_{in}$. The input in-phase signal $I_i$ and the input quadrature signal $Q_i$ have 90° phase difference. The in-phase amplifier I-Amp receives the input in-phase signal $I_i$ and generates an intermediate in-phase signal $I_m$; the quadrature amplifier Q-Amp receives the input quadrature signal $Q_i$ and generates the intermediate quadrature signal $Q_m$. The switching circuit 14 comprises a plurality of switches (which will be illustrated later on) and receives a plurality of bits $B_i, \ldots, B_N$, where the bits $B_i, \ldots, B_N$ are configured to control an ON-OFF status of the plurality of switches. The switching circuit 14 is configured to adjust the input in-phase signal $I_i$ to generate an output in-phase signal $I_o$, and to adjust the input quadrature signal $Q_i$ to generate an output quadrature signal $Q_o$, according to the bits $B_i, \ldots, B_N$. The combining module 16 is configured to combine the output in-phase signal $I_o$ and the output quadrature signal $Q_o$ to generate an output RF signal $RF_{out}$.

The signals $RF_{in}$, $I_i$, $Q_i$, $I_m$, $Q_m$, $I_o$, $Q_o$ and $RF_{out}$ may be voltage signals or current signals. In an embodiment, the signals $RF_{in}$, $I_i$, $Q_i$, $I_m$, $Q_m$, $I_o$, $Q_o$ and $RF_{out}$ are all differential signals, but not limited thereto. For example, as illustrated in FIG. 1, the RF signal $RF_{in}/RF_{out}$ comprises a positive input/output RF signal $RF_{in+}/RF_{out+}$ and a negative input/output RF signal $RF_{in-}/RF_{out-}$, the input/intermediate/output in-phase signal $I_i/I_m/I_o$ comprises a positive input/intermediate/output in-phase signal $I_{i+}/I_{m+}/I_{o+}$ and a negative input/intermediate/output in-phase signal $I_{i-}/I_{m-}/I_{o-}$, and the input/intermediate/output quadrature signal $Q_i/Q_m/Q_o$ comprises a positive input/intermediate/output quadrature signal $Q_{i+}/Q_{m+}/Q_{o+}$ and a negative input/intermediate/output quadrature signal $Q_{i-}/Q_{m-}/Q_{o-}$.

The in-phase amplifier I-Amp and the quadrature amplifier Q-Amp are full differential amplifiers. The in-phase amplifier I-Amp comprises a positive in-phase output terminal $O_{I+}$ and a negative in-phase output terminal $O_{I-}$. The quadrature amplifier Q-Amp comprises a positive quadrature output terminal $O_{Q+}$ and a negative quadrature output terminal $O_{Q-}$.

In this regard, the combining module 16 may comprise a first combining element CE+ and a second combining element CE−. The first combining element CE+ is configured to generate the positive output RF signal $RF_{out+}$ by combining the positive output in-phase signal $I_{o+}$ and the positive output quadrature signal $Q_{o+}$. The positive output RF signal $RF_{out+}$ may be expressed as $RF_{out+}=I_{o+}+j*Q_{o+}$. The second combining element CE− is configured to generate the negative output RF signal $RF_{out+}$ by combining the negative output in-phase signal $I_{o-}$ and the negative output quadrature signal $Q_{o-}$. The negative output RF signal $RF_{out-}$ may be expressed as $RF_{out-}=I_{o-}+j*Q_{o-}$.

Figure 2:
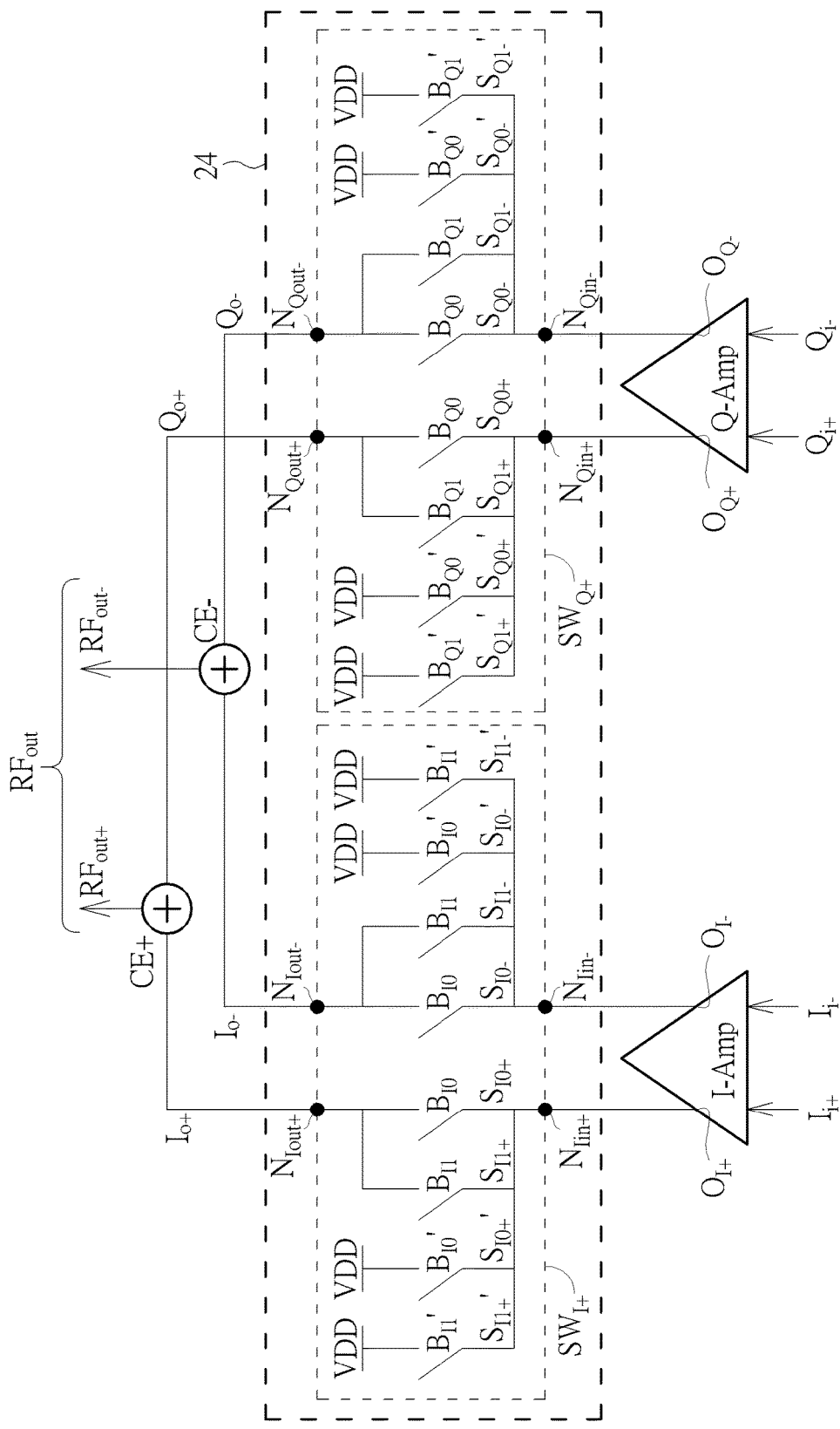
FIG. 2 is a schematic diagram of a switching circuit according to an embodiment of the present invention.

FIG. 2 is a schematic diagram of a switching circuit 24 according to an embodiment of the present invention. The switching circuit 24 is an embodiment of the switching circuit 14. The switching circuit 24 comprises a first in-phase switching sub-circuit $SW_{I+}$ and a first quadrature switching sub-circuit $SW_{Q+}$. The in-phase switching sub-circuit $SW_{I+}$ and the quadrature switching sub-circuit $SW_{Q+}$ have similar circuit structure.

The first in-phase switching sub-circuit $STAI_{I+}$ comprises a first in-phase switching input terminal $N_{Iin+}$, a second in-phase switching input terminal $N_{Iin-}$, a first in-phase switching output terminal $N_{Iout+}$, a second in-phase switching output terminal $N_{Iout-}$, in-phase conducting switches $S_{I1+}$, $S_{I0+}$, $S_{I0-}$, $S_{I-}$ and in-phase diverting switches $S_{I1+}'$, $S_{I0+}'$, $S_{I1-}'$, $S_{I0-}'$. The first in-phase switching input terminal $N_{Iin+}$ of the in-phase switching sub-circuit $SW_{I+}$ is coupled to the positive in-phase output terminal $O_{I+}$. The second in-phase switching input terminal $N_{Iin-}$ of the in-phase switching sub-circuit $SW_{I+}$ is coupled to the negative in-phase output terminal $O_{I-}$. The in-phase conducting switches $S_{I1+}$, $S_{I0+}$, controlled by in-phase conducting bits $B_{I0}$, $B_{I1}$, are coupled between the first in-phase switching input terminal $N_{Iin+}$ and the first in-phase switching output terminal $N_{Iout+}$. The in-phase conducting switches $S_{I0-}$, $S_{I1-}$, also controlled by the in-phase conducting bits $B_{I0}$, $B_{I1}$, are coupled between the second in-phase switching input terminal $N_{Iin-}$ and the second in-phase switching output terminal $N_{Iout-}$. The in-phase diverting switches $S_{I1+}'$, $S_{I0+}'$, controlled by in-phase diverting bits $B_{I0}'$, $B_{I1}'$, have one terminal coupled to the first in-phase switching input terminal $N_{Iin+}$ and have another terminal to receive a voltage VDD. The in-phase diverting switches $S_{I1-}'$, $S_{I0-}'$, also controlled by the in-phase diverting bits $B_{I0}'$, $B_{I1}'$, have one terminal coupled to the second in-phase switching input terminal $N_{Iin-}$ and have another terminal to receive the voltage VDD. The in-phase diverting bits $B_{I0}'$, $B_{I1}'$, are complements of the in-phase conducting bits $B_{I0}$, $B_{I1}$.

The first quadrature switching sub-circuit $SW_{Q+}$ comprises a first quadrature switching input terminal $N_{Qin+}$, a second quadrature switching input terminal $N_{Qin-}$, a first quadrature switching output terminal $N_{Qout+}$, a second quadrature switching output terminal $N_{Qout-}$, quadrature conducting switches $S_{Q1+}$, $S_{Q0+}$, $S_{Q0-}$, $S_{Q1-}$ and quadrature diverting switches $S_{Q1+}'$, $S_{Q0+}'$, $S_{Q1-}'$, $S_{Q0-}'$. The first quadrature switching input terminal $N_{Qin+}$ of the quadrature switching sub-circuit $SW_{Q+}$ is coupled to the positive quadrature output terminal $O_{Q+}$. The second quadrature switching input terminal $N_{Qin-}$ of the quadrature switching sub-circuit $SW_{Q+}$ is coupled to the negative quadrature output terminal $O_{Q-}$. The quadrature conducting switches $S_{Q1+}$, $S_{Q0+}$, controlled by quadrature conducting bits $B_{Q0}$, $B_{Q1}$, are coupled between the first quadrature switching input terminal $N_{Qin+}$ and the first quadrature switching output terminal $N_{Qout+}$. The quadrature conducting switches $S_{Q0-}$, $S_{Q1-}$, also controlled by the quadrature conducting bits $B_{Q0}$, $B_{Q1}$, are coupled between the second quadrature switching input terminal $N_{Qin-}$ and the second quadrature switching output terminal $N_{Qout-}$. The quadrature diverting switches $S_{Q1+}'$, $S_{Q0+}'$, controlled by quadrature diverting bits $B_{Q0}'$, $B_{Q1}'$, have one terminal coupled to the first quadrature switching input terminal $N_{Qin+}$ and have another terminal to receive the voltage VDD. The quadrature diverting switches $S_{Q1-}'$, $S_{Q0-}'$, also controlled by the quadrature diverting bits $B_{Q0}'$, $B_{Q1}'$, have one terminal coupled to the second quadrature switching input terminal $N_{Qin-}$ and have another terminal to receive the voltage VDD.

The conducting bits $B_{I0}$, $B_{I1}$, $B_{Q0}$, $B_{Q1}$ (or the diverting bits $B_{I0}'$, $B_{I1}'$, $B_{Q0}'$, $B_{Q1}'$) of the switching circuit 24 may be regarded as the bits $B_1, \ldots, B_N$ of the switching circuit 14. The diverting bits $B_{I0}'$, $B_{I1}'$, $B_{Q0}'$, $B_{Q1}'$ are complements of the conducting bits $B_{I0}$, $B_{I1}$, $B_{Q0}$, $B_{Q1}$. That is, $B_{I0}'=0$ when $B_{I0}=1$ and $B_{I0}'=1$ when $B_{I0}=0$, for instance.

Figure 3:
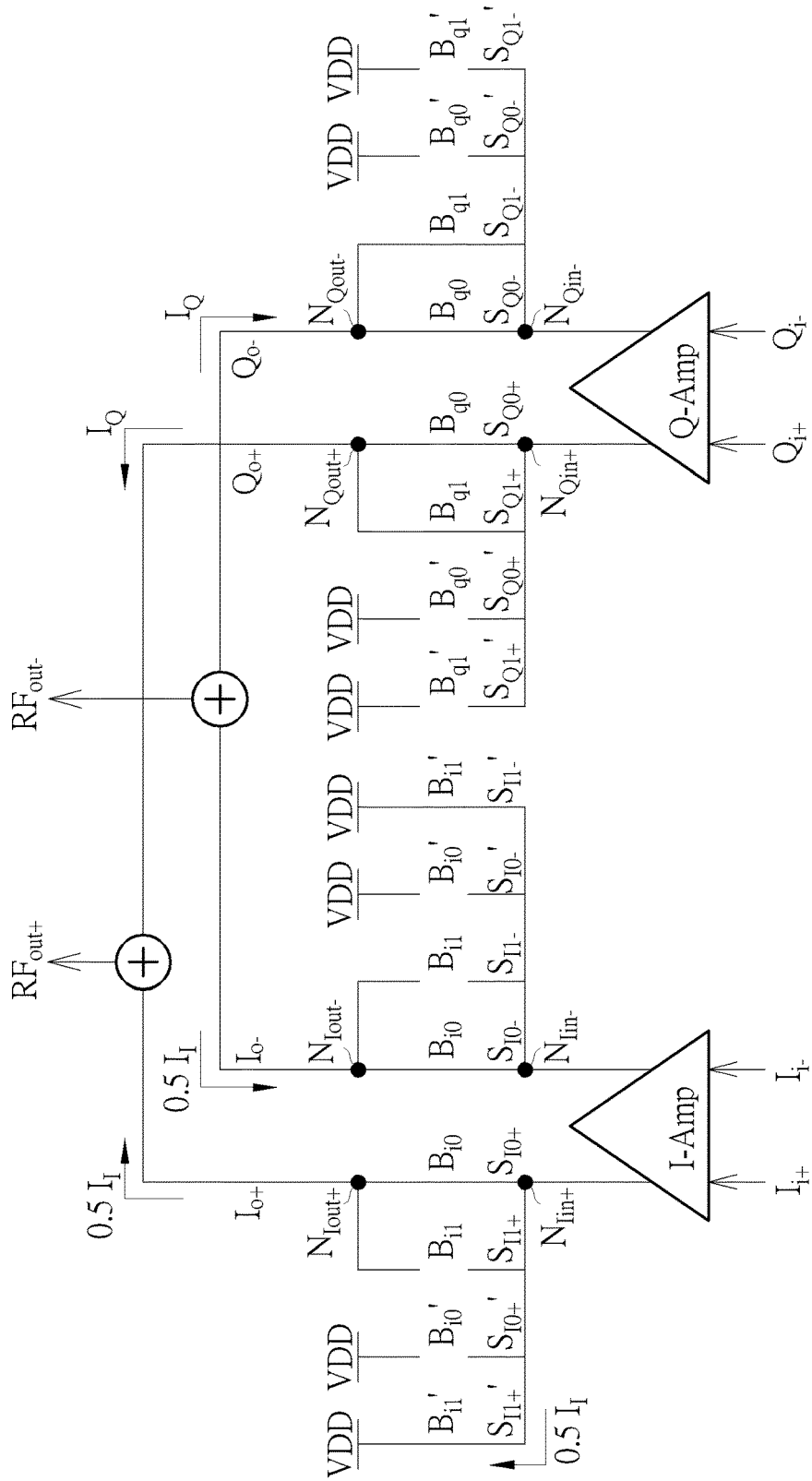
FIG. 3 is a schematic diagram of a conduction status of the switching circuit of FIG. 2.

Operations of the switching circuit 24 are described as follows. FIG. 3 is a schematic diagram of a conduction status of the switching circuit 24. Suppose that $(B_{I0}, B_{I1}, B_{Q0}, B_{Q1})$ is $(1, 0, 1, 1)$, which means that the switches $S_{I0+}$, $S_{I0-}$, $S_{I1+}'$, $S_{I1-}'$, $S_{Q1+}$, $S_{Q0+}$, $S_{Q0-}$, $S_{Q1-}$ are conducted (ON) and the switches $S_{I1+}$, $S_{I1-}$, $S_{I0+}'$, $S_{I0-}'$, $S_{Q1+}'$, $S_{Q0+}'$, $S_{Q1-}'$, $S_{Q0-}'$ are cutoff (OFF). Suppose that an output current of the in-phase amplifier I-Amp is denoted as $I_I$ and an output current of the quadrature amplifier Q-Amp is denoted as $I_Q$. Within the in-phase switching sub-circuit $SW_{I+}$, half of the output current $I_I$ (i.e., 0.5 $I_I$) would flow through the conducting switches $S_{I0+}$, $S_{I0-}$ and another half of the output current $I_I$ (i.e., 0.5 $I_I$) would be diverted through the diverting switches $S_{I1+}'$, $S_{I1-}'$. Current through the in-phase switching output terminals $N_{Iout+}$, $N_{Iout-}$ would be 0.5 $I_I$. On the other hand, within the quadrature switching sub-circuit $SW_{Q+}$, all of the output current $I_Q$ would flow through the conducting switches $S_{Q1+}$, $S_{Q0+}$, $S_{Q0-}$, $S_{Q1-}$ and no current is diverted through the diverting switches $S_{Q1+}'$, $S_{Q0+}'$, $S_{Q1-}'$, $S_{Q0-}'$. Current through the quadrature switching output terminals $N_{Qout+}$, $N_{Qout-}$ would be $I_Q$. Therefore, the output RF signal $RF_{out}$ would have a phase $\theta$ as $\tan^{-1}(|I_Q|/0.5|I_I|)$, where $\tan^{-1}(\cdot)$ denotes an inverse of tangent function. Suppose that $|I_Q|=|I_I|$, meaning that the in-phase amplifier I-Amp and the quadrature amplifier Q-Amp produces the same output current, the phase difference $\theta$ is $\tan^{-1}(2)$.

In another perspective, the switching circuit 24 is controlled mainly by 4 bits, where 2 bits are used for controlling in-phase component (i.e., the output in-phase signal $I_o$) and 2 bits are used for quadrature component (i.e., the output quadrature signal $Q_o$), which is for illustrative purpose. In practice, the switching circuit 14 may be controlled by 2*M bits, where M bits are used for controlling/adjusting in-phase component and M bits are used for controlling/adjusting the quadrature component, and various values of the phase difference $\theta$ would be generated.

In the prior art, the vector modulator utilizes variable gain amplifier (VGA) to adjust the in-phase component and the quadrature component. However, the VGA needs an analog signal to control the gain of the VGA, and a DAC is required, which increases a circuit complexity since the DAC is complicated. In comparison, by utilizing the switching circuit of the present invention, the digital bits $B_1, \ldots, B_N$ (e.g., the conducting bits $B_{I0}$, $B_{I1}$, $B_{Q0}$, $B_{Q1}$ or the diverting bits $B_{I0}'$, $B_{I1}'$, $B_{Q0}'$, $B_{Q1}'$) can be directly used to control/adjust the in-phase component and the quadrature component, such that the complexity and the production cost brought by DAC may be spared.

Note that, the switching circuit 24 generates the phase difference $\theta$ only within a range between 0° and 90°, i.e., the first quadrant of a complex plane, and not limited thereto. The switching circuit of the present invention may generate the phase difference $\theta$ distributed over a range between 0° and 360°.

Figure 4:
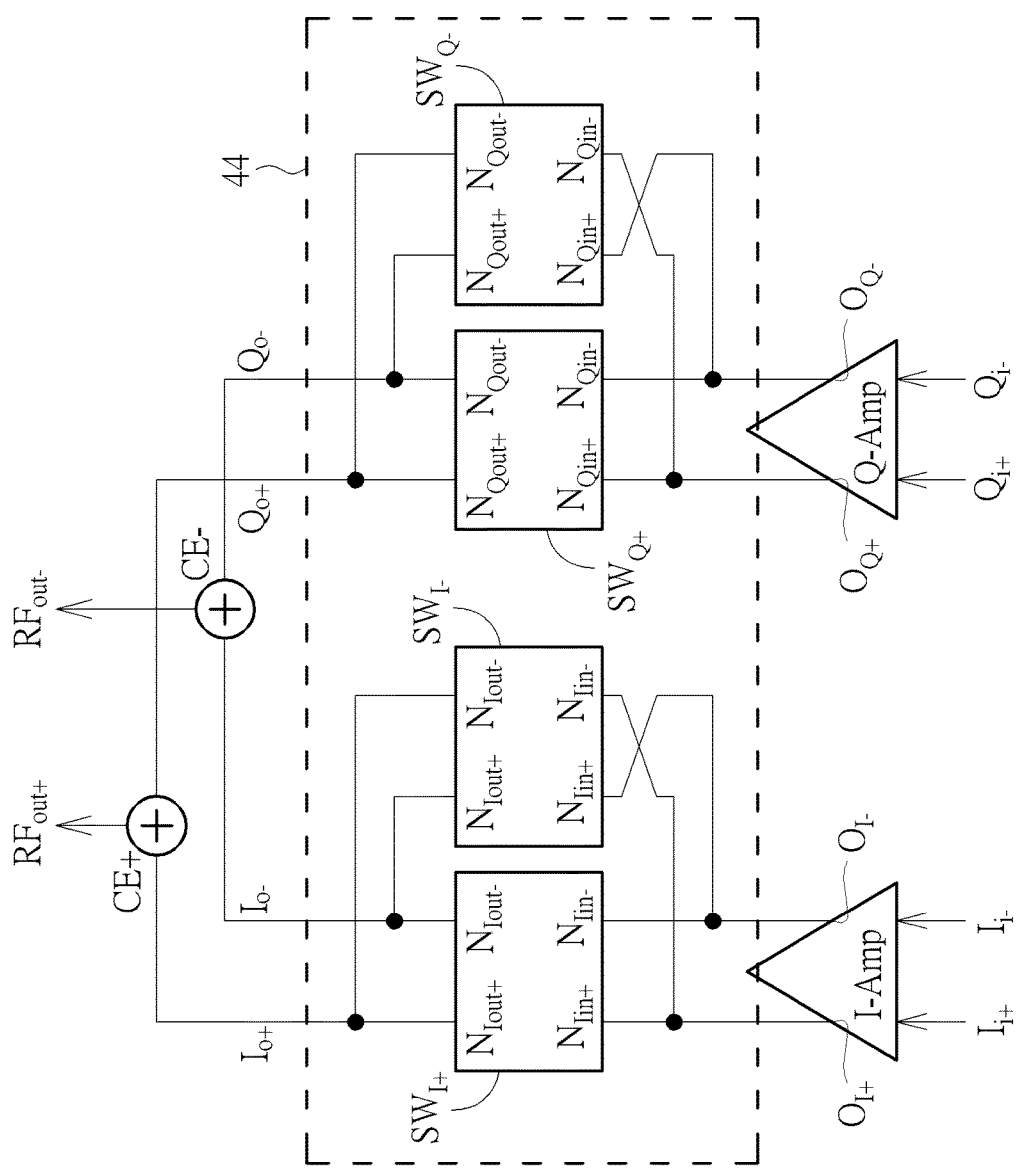
FIG. 4 is a schematic diagram of a switching circuit according to an embodiment of the present invention.

For example, FIG. 4 is a schematic diagram of a switching circuit 44 according to an embodiment of the present invention. The switching circuit 44 is similar to the switching circuit 24, and thus, the same denotations are applied. Different from the switching circuit 24, the switching circuit 44 further comprises a second in-phase switching sub-circuit $SW_{I-}$ and a second quadrature switching sub-circuit $SW_{Q-}$, in addition to the first in-phase switching sub-circuit $SW_{I+}$ and the first quadrature switching sub-circuit $SW_{Q+}$. The in-phase switching sub-circuit $SW_{I-}$ has the same circuit structure as the in-phase switching sub-circuit $SW_{I+}$, and the quadrature switching sub-circuit $SW_{Q-}$ has the same circuit structure as the quadrature switching sub-circuit $SW_{Q+}$. Different from the switching sub-circuit $SW_{I+}$ and $SW_{Q+}$, a first in-phase switching input terminal $N_{Iin+}$ of the second in-phase switching sub-circuit $SW_{I-}$ is coupled to the negative in-phase output terminal $O_{I-}$, a second in-phase switching input terminal $N_{Iin-}$ of the second in-phase switching sub-circuit $SW_{I-}$ is coupled to the positive in-phase output terminal $O_{I+}$, a first quadrature switching input terminal $N_{Qin+}$ of the second quadrature switching sub-circuit $SW_{Q-}$ is coupled to the negative quadrature output terminal $O_{Q-}$, and a second quadrature switching input terminal $N_{Qin-}$ of the second quadrature switching sub-circuit $SW_{Q-}$ is coupled to the positive quadrature output terminal $O_{Q+}$.

In other words, a current direction of the current flowing through the second in-phase switching sub-circuit $SW_{I-}$ would be opposite to a current direction of the current flowing through the first in-phase switching sub-circuit $SW_{I+}$, and a current direction of the current flowing through the second quadrature switching sub-circuit $SW_{Q-}$ would be opposite to a current direction of the current flowing through the first quadrature switching sub-circuit $SW_{Q+}$.

When the sub-circuits $SW_{I-}$ and $SW_{Q+}$ are enabled, the switching circuit 44 is able to generate the phase difference θ within a range between 90° and 180°, i.e., the second quadrant. When the sub-circuits $SW_{I-}$ and $SW_{Q-}$ are enabled, the switching circuit 44 is able to generate the phase difference θ within a range between 180° and 270°, i.e., the third quadrant. When the sub-circuits $SW_{I+}$ and $SW_{Q-}$ are enabled, the switching circuit 44 is able to generate the phase difference θ within a range between 270° and 360°, i.e., the fourth quadrant. Therefore, the switching circuit 44 is able to generate the phase difference θ distributed over the range between 0° and 360°.

In summary, the vector modulator utilizes the switching circuit comprising the plurality of switches and controlled by the plurality of bits to control/adjust the in-phase component and the quadrature component, such that the complexity and the production cost brought by DAC may be spared.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A vector modulator, comprising:
   a quadrature component generator, configured to generate an input in-phase signal and an input quadrature signal according to an input radio frequency (RF) signal;
   a switching circuit, receiving a plurality of bits, comprising a plurality of switches controlled by the plurality of bits, configured to generate an output in-phase signal and an output quadrature signal according to the plurality of bits, where the output in-phase signal and the output quadrature signal are related to input in-phase signal and the input quadrature signal; and
   a combining module, configured to generate an output RF signal according to the output in-phase signal and the output quadrature signal.

2. The vector modulator of claim 1, wherein the switching circuit comprises:
   a switching input terminal, coupled to the quadrature component generator;
   a switching output terminal, coupled to the combining module;
   a plurality of conducting switches, coupled between the switching input terminal and the switching output terminal, controlled by a plurality of conducting bits within the plurality of bits; and
   a plurality of diverting switches, coupled to the switching input terminal and receiving a voltage, controlled by a plurality of diverting bits within the plurality of bits, wherein the plurality of diverting bits are complements of the plurality of conducting bits.

3. The vector modulator of claim 1, further comprising an in-phase amplifier, coupled between the quadrature component generator and the switching circuit, configured to receive the input in-phase signal and output an intermediate in-phase signal; and
   a quadrature amplifier, coupled between the quadrature component generator and the switching circuit, configured to receive the input quadrature signal and output an intermediate quadrature signal.

4. The vector modulator of claim 3, wherein
   the input in-phase signal comprises a first input in-phase signal and a second input in-phase signal;
   the input quadrature signal comprises a first input quadrature signal and a second input quadrature signal;
   the in-phase amplifier comprises a first in-phase output terminal and a second in-phase output terminal;
   the quadrature amplifier comprises a first quadrature output terminal and a second quadrature output terminal;
   the intermediate in-phase signal comprises a first intermediate in-phase signal and a negative intermediate in-phase signal;
   the intermediate quadrature signal comprises a first intermediate quadrature signal and a negative intermediate quadrature signal;
   the output in-phase signal comprises a first output in-phase signal and a second output in-phase signal;
   the output quadrature signal comprises a first output quadrature signal and a second output quadrature signal;
   the output RF signal comprises a first output RF signal and a second output RF signal; and
   the combining module comprises:
      a first combining element, configured to generate the first output RF signal according to the first output in-phase signal and the first output quadrature signal; and
      a second combining element, configured to generate the second output RF signal according to the second output in-phase signal and the second output quadrature signal.

5. The vector modulator of claim 4, wherein the switching circuit comprises:
   a first in-phase switching sub-circuit, comprising:
      a first in-phase switching input terminal, coupled to the first in-phase output terminal of the in-phase amplifier;
      a second in-phase switching input terminal, coupled to the second in-phase output terminal of the in-phase amplifier;
      a first in-phase switching output terminal;
      a second in-phase switching output terminal;
      a plurality of first in-phase conducting switches, coupled between the first in-phase switching input terminal and the first in-phase switching output terminal, controlled by a plurality of in-phase conducting bits within the plurality of bits; and a plurality of second in-phase conducting switches, coupled between the second in-phase switching input terminal and the second in-phase switching output terminal, controlled by the plurality of in-phase conducting bits within the plurality of bits;

a plurality of first in-phase diverting switches, coupled to the first in-phase switching input terminal and receiving a voltage, controlled by a plurality of in-phase diverting bits within the plurality of bits, wherein the plurality of in-phase diverting bits are complements of the plurality of in-phase conducting bits; and a plurality of second in-phase diverting switches, coupled to the second in-phase switching input terminal and receiving the voltage, controlled by the plurality of in-phase diverting bits; and a first quadrature switching sub-circuit, comprising:

a first quadrature switching input terminal, coupled to the first quadrature output terminal of the quadrature amplifier;

a second quadrature switching input terminal, coupled to the second quadrature output terminal of the quadrature amplifier;

a first quadrature switching output terminal;

a second quadrature switching output terminal;

a plurality of first quadrature conducting switches, coupled between the first quadrature switching input terminal and the first quadrature switching output terminal, controlled by a plurality of quadrature conducting bits within the plurality of bits;

a plurality of second quadrature conducting switches, coupled between the second quadrature switching input terminal and the second quadrature switching output terminal, controlled by the plurality of quadrature conducting bits within the plurality of bits;

a plurality of first quadrature diverting switches, coupled to the first quadrature switching input terminal and receiving the voltage, controlled by a plurality of quadrature diverting bits within the plurality of bits, wherein the plurality of quadrature diverting bits are complements of the plurality of first quadrature conducting bits; and a plurality of second quadrature diverting switches, coupled to the second quadrature switching input terminal and receiving the voltage, controlled by the plurality of quadrature diverting bits.

6. The vector modulator of claim 5, wherein the switching circuit comprises:

a second in-phase switching sub-circuit, comprising:

a first in-phase switching input terminal, coupled to the second in-phase output terminal of the in-phase amplifier;

a second in-phase switching input terminal, coupled to the first in-phase output terminal of the in-phase amplifier;

a first in-phase switching output terminal;

a second in-phase switching output terminal;

a plurality of first in-phase conducting switches, coupled between the first in-phase switching input terminal and the first in-phase switching output terminal, controlled by a plurality of in-phase conducting bits within the plurality of bits; and a plurality of second in-phase conducting switches, coupled between the second in-phase switching input terminal and the second in-phase switching output terminal, controlled by the plurality of in-phase conducting bits within the plurality of bits;

a plurality of first in-phase diverting switches, coupled to the first in-phase switching input terminal and receiving the voltage, controlled by a plurality of in-phase diverting bits within the plurality of bits, wherein the plurality of first in-phase diverting bits are complements of the plurality of in-phase conducting bits; and a plurality of second in-phase diverting switches, coupled to the second in-phase switching input terminal and receiving the voltage, controlled by the plurality of in-phase diverting bits; and a second quadrature switching sub-circuit, comprising:

a first quadrature switching input terminal, coupled to the second quadrature output terminal of the quadrature amplifier;

a second quadrature switching input terminal, coupled to the first quadrature output terminal of the quadrature amplifier;

a first quadrature switching output terminal;

a second quadrature switching output terminal;

a plurality of first quadrature conducting switches, coupled between the first quadrature switching input terminal and the first quadrature switching output terminal, controlled by a plurality of quadrature conducting bits within the plurality of bits;

a plurality of second quadrature conducting switches, coupled between the second quadrature switching input terminal and the second quadrature switching output terminal, controlled by the plurality of quadrature conducting bits within the plurality of bits;

a plurality of first quadrature diverting switches, coupled to the first quadrature switching input terminal and receiving the voltage, controlled by a plurality of quadrature diverting bits within the plurality of bits, wherein the plurality of first quadrature diverting bits are complements of the plurality of first quadrature conducting bits; and a plurality of second quadrature diverting switches, coupled to the second quadrature switching input terminal and receiving the voltage, controlled by the plurality of quadrature diverting bits.

* * * * *

UNITED STATES PATENT AND TRADEMARK OFFICE
CERTIFICATE OF CORRECTION

PATENT NO. : 10,476,717 B1
APPLICATION NO. : 16/234484
DATED : November 12, 2019
INVENTOR(S) : Tao Wang et al.

Page 1 of 1

It is certified that error appears in the above-identified patent and that said Letters Patent is hereby corrected as shown below:

On the Title Page

Item (73), correct the name of the assignee from "National Chung-Shan Institue of Science and Technology" to --National Chung-Shan Institute of Science and Technology--.

Signed and Sealed this
Twenty-first Day of January, 2020

Andrei Iancu
*Director of the United States Patent and Trademark Office*